United States Patent
Duan et al.

(10) Patent No.: US 12,393,048 B1
(45) Date of Patent: Aug. 19, 2025

(54) SINGLE-LAMP DUAL-EMISSION THREE-DIMENSIONAL (3D) LIGHT EMITTING DIODE (LED) DISPLAY SCREEN

(71) Applicant: CANBEST OPTO-ELECTRICAL SCIENCE & TECHNOLOGY CO., LTD, Zhengzhou (CN)

(72) Inventors: Wantong Duan, Zhengzhou (CN); Shuzheng Li, Zhengzhou (CN)

(73) Assignee: CANBEST OPTO-ELECTRICAL SCIENCE & TECHNOLOGY CO., LTD, Zhengzhou (CN)

( * ) Notice: Subject to any disclaimer, the term of this patent is extended or adjusted under 35 U.S.C. 154(b) by 0 days.

(21) Appl. No.: 19/180,198

(22) Filed: Apr. 16, 2025

(30) Foreign Application Priority Data

Aug. 2, 2024 (CN) .......................... 202411058484.5

(51) Int. Cl.
*G02B 30/25* (2020.01)
*H05K 7/20* (2006.01)

(52) U.S. Cl.
CPC ......... *G02B 30/25* (2020.01); *H05K 7/20963* (2013.01)

(58) Field of Classification Search
None
See application file for complete search history.

(56) References Cited

U.S. PATENT DOCUMENTS

| 2007/0153526 A1* | 7/2007 | Lim | F21V 19/0055 362/294 |
| 2008/0285285 A1* | 11/2008 | Chang | H05K 7/20963 362/294 |
| 2013/0155723 A1* | 6/2013 | Coleman | G02B 6/0028 362/621 |
| 2018/0010776 A1* | 1/2018 | Shim | F21K 9/232 |

FOREIGN PATENT DOCUMENTS

| CN | 103197427 A | | 7/2013 | |
| KR | 20140056788 A | * | 5/2014 | ............. G02B 27/26 |

* cited by examiner

*Primary Examiner* — Jyotsna V Dabbi
(74) *Attorney, Agent, or Firm* — Bayramoglu Law Offices LLC

(57) ABSTRACT

A single-lamp dual-emission three-dimensional (3D) light emitting diode (LED) display screen is provided. The single-lamp dual-emission 3D LED display screen includes a plurality of LED integrated panels that are distributed uniformly in a horizontal direction and a vertical direction, where the LED integrated panel is provided with an LED single-lamp array; a heat dissipation housing is provided at a rear side of the LED single-lamp array; a heat dissipation structure is provided on a back side of the LED single-lamp array in the heat dissipation housing; and a left side and a right side of the heat dissipation housing each are provided with a snap-fit mechanism. The LED single-lamp array is composed of a plurality of LED single lamps that are arranged symmetrically. The LED single lamp includes two LED light emitting pixels that are arranged left and right.

6 Claims, 21 Drawing Sheets dissipation housing is connected to the snap-fit mechanism of the adjacent heat dissipation housing through the snap-fit mechanism; the LED single-lamp array is composed of a plurality of LED single lamps that are arranged symmetrically; the LED single lamp includes two LED light emitting pixels that are arranged left and right; the LED light emitting pixels each include a yellow LED bead, a green LED bead, and a blue LED bead; a left-right eye retardation film and a polarizing film are correspondingly provided on a front surface of the LED single-lamp array in sequence; a printed circuit board (PCB) is provided on a rear portion of the LED integrated panel; a driver chip is provided on the PCB; and the driver chip is configured to control the corresponding LED light emitting pixel in the LED single-lamp array to emit light according to a preset rule.
SINGLE-LAMP DUAL-EMISSION THREE-DIMENSIONAL (3D) LIGHT EMITTING DIODE (LED) DISPLAY SCREEN

CROSS-REFERENCE TO THE RELATED APPLICATIONS

This application is based upon and claims priority to Chinese Patent Application No. 202411058484.5, filed on Aug. 2, 2024, the entire contents of which are incorporated herein by reference.

TECHNICAL FIELD

The present disclosure relates to a display screen, and in particular to a single-lamp dual-emission three-dimensional (3D) light emitting diode (LED) display screen.

BACKGROUND

The principle of a 3D LED display screen depends mainly on the stereoscopic display. By displaying distinct images for a left eye and a right eye at the same time, and then synthesizing the two images through the brain nerve with a spatial resolving power of human eyes, a stereoscopic sense is formed. The core principle underlying this display technology is "stereoscopic imaging".

Through research, the Chinese Patent Application No. CN 103197427 A provides a naked-eye 3D LED display screen and a production process thereof. The naked-eye 3D LED display screen overcomes the problem that the separation of the LED display and the 3D grating is not conducive to the alignment of the grating and the LED display, and can realize a large area, high-brightness and naked-eye LED 3D display. The naked-eye 3D LED display screen includes an LED display module and a transparent grating panel. The transparent grating panel is fixedly provided on the LED display module and located directly in front of an LED array. The production process of the naked-eye 3D LED display screen includes: (1) Material preparation: the LED display module, two optical gratings made of a film material, and three acrylic plates are provided; (2) fabrication of the transparent grating panel; and (3) fixation and formation: the transparent grating panel fabricated in the step (2) is fixedly provided on the LED display module in the step (1) and located directly in front of the LED array, thereby obtaining the naked-eye 3D LED display screen.

According to the above solution, by providing the synthetic transparent grating panel in front of the existing LED display module, the LED display screen can realize the large-area, high-brightness and naked-eye 3D LED display. However, this solution still has some shortcomings: The frequency for dynamically displaying images is low. The spatial computational algorithm has a long processing time. The display effect makes the viewer dizzy easily. Meanwhile, the LED dot-matrix display screen has a low resolution to affect the image quality.

The 3D LED display screen includes a plurality of LED integrated panels. A housing is provided on a back side of the LED integrated panel. In assembly of the LED integrated panels, adjacent housings are fixed by a bolt, thereby splicing the LED integrated panels. In the assembly, each LED integrated panel is fixed by the bolt to cause low assembly efficiency. Meanwhile, when the individual LED integrated panel is to be disassembled in use, due to a limited operating space, the disassembly is inconvenient, and the later maintenance is intractable. Furthermore, the 3D LED display screen produces a large amount of heat in operation. If the temperature is not controlled in a way that is desirable, then the service life of the 3D LED display screen is directly affected.

SUMMARY

An objective of the present disclosure is to provide a single-lamp dual-emission 3D LED display screen. The present disclosure can effectively improve the resolution of the display screen through the single-lamp dual-emission technology, prevents dizziness of the viewer due to the undesirable dynamic display performance, has advantages of convenience in assembly and disassembly of the LED integrated panel, and facilitates later maintenance and repair.

The present disclosure adopts following technical solutions: A single-lamp dual-emission 3D LED display screen includes a plurality of LED integrated panels that are distributed uniformly in a horizontal direction and a vertical direction, where the LED integrated panel is provided with an LED single-lamp array; a heat dissipation housing is provided at a rear side of the LED single-lamp array; a heat dissipation structure is provided on a back side of the LED single-lamp array in the heat dissipation housing; a left side and a right side of the heat dissipation housing each are provided with a snap-fit mechanism; the heat dissipation housing is connected to the snap-fit mechanism of the adjacent heat dissipation housing through the snap-fit mechanism; the LED single-lamp array is composed of a plurality of LED single lamps that are arranged symmetrically; the LED single lamp includes two LED light emitting pixels that are arranged left and right; the LED light emitting pixels each include a yellow LED bead, a green LED bead, and a blue LED bead; a left-right eye retardation film and a polarizing film are correspondingly provided on a front surface of the LED single-lamp array in sequence; a printed circuit board (PCB) is provided on a rear portion of the LED integrated panel; a driver chip is provided on the PCB; and the driver chip is configured to control the corresponding LED light emitting pixel in the LED single-lamp array to emit light according to a preset rule.

Further, the snap-fit mechanism includes a shell fixed to an inner top wall of the heat dissipation housing; an insert is fixedly provided at an outer end of the shell; the shell is located inside the heat dissipation housing; the insert is located outside the heat dissipation housing; a semi-circular groove is formed at a junction between the insert and the shell; a semi-circular member is rotatably connected in the semi-circular groove; a force rod is fixedly provided on an outer surface of the semi-circular member; and a tension spring is fixedly provided between one side of the force rod and an inner bottom wall of the shell.

Further, a heat-dissipating aluminum plate is fixedly provided on a rear side of the LED single-lamp array; the heat-dissipating aluminum plate is fixed with the shell through a first bolt; an upper portion and a lower portion of each of the left side and the right side of the heat dissipation housing each are provided with a gap matching with the insert; and a cover plate is fixedly provided on a rear side of the heat dissipation housing through a second bolt.

Further, a connector is fixedly provided between two corresponding shells in the heat dissipation housing in a front-rear direction; and the connector is configured to connect the heat dissipation housing and the shells integrally.

Further, an upper end and a lower end of the heat dissipation housing each are provided with an avoidance notch; and the force rod is located in the corresponding avoidance notch.

Further, a frame is fixedly provided around the 3D LED display screen; a rear plate is fixedly provided on a rear side of the frame; a heat dissipation space is formed between the frame and the rear plate; an air circulation system is provided on the frame; the air circulation system includes an air outlet formed in an upper portion of a side of the frame; and an exhaust fan and a motor are provided in the air outlet.

Further, the LED single lamp includes a hollow lampshade and six LED beads provided on an inner rear end surface of the lampshade; the six LED beads are formed into the two LED light emitting pixels that are arranged symmetrically left and right; the LED light emitting pixels each include the yellow LED bead, the green LED bead, and the blue LED bead; and a rear end of the LED bead is welded at a corresponding position of the PCB through a pin.

Further, the left-right eye retardation film includes a left eye retardation film and a right eye retardation film; and the left eye retardation film and the right eye retardation film are respectively provided in front of a corresponding left row of three beads and in front of a corresponding right row of three beads.

Further, an optical microcrystalline mask is provided on a front surface of the LED integrated panel; and the optical microcrystalline mask is formed between the LED integrated panel and the left-right eye retardation film by potting.

Further, the heat dissipation structure includes a heat-dissipating aluminum plate provided at a rear end of the LED integrated panel; a temperature sensing mechanism is further provided behind the heat-dissipating aluminum plate; a thermal expansion portion is concentrically provided in the temperature sensing mechanism; the LED heat dissipation structure further includes a heat dissipation fin adjusting mechanism, a rotary fin, and a stationary fin; and the thermal expansion portion is configured to adjust a contact area between the rotary fin and the stationary fin through the heat dissipation fin adjusting mechanism based on a temperature signal acquired by the temperature sensing mechanism.

1. According to the present disclosure, the LED single-lamp array is composed of a plurality of LED single lamps that are arranged symmetrically. The LED single lamp includes two LED light emitting pixels that are arranged left and right. The LED light emitting pixels each include the yellow LED bead, the green LED bead, and the blue LED bead. The PCB is provided on the rear portion of the LED integrated panel. The driver chip is provided on the PCB. The driver chip is configured to control the corresponding LED light emitting pixel in the LED single-lamp array to emit light according to the preset rule. The present disclosure realizes high dynamic range (HDR) display, and prevents the dizziness of the viewer due to the undesirable dynamic display performance.

2. According to the present disclosure, the left side and the right side of the heat dissipation housing each are provided with the snap-fit mechanism. Each LED integrated panel to be assembled is assembled through the snap-fit mechanism, thereby forming the large-area 3D LED display screen. Meanwhile, through the snap-fit mechanism, the present disclosure facilitates disassembly of the individual LED integrated panel, and facilitates later maintenance.

3. According to the present disclosure, the upper portion and the lower portion of each of the left side and the right side of the heat dissipation housing each are provided with the gap matching with the insert. The cover plate is provided on the rear side of the heat dissipation housing. When the cover plate is removed for maintenance in the heat dissipation housing, and some LED integrated panel is disassembled, the corresponding cover plate is removed first, then the first bolt is disassembled, and the LED integrated panel is taken down from the front side. By this time, only the heat dissipation housing is clamped in the whole 3D LED display screen. Then, pulling the heat dissipation housing backward can pull out the heat dissipation housing. The present disclosure realizes separate disassembly of the LED integrated panel.

DETAILED DESCRIPTION OF THE EMBODIMENTS

The present disclosure is described in detail below with reference to the drawings and embodiments.

Figure 1:
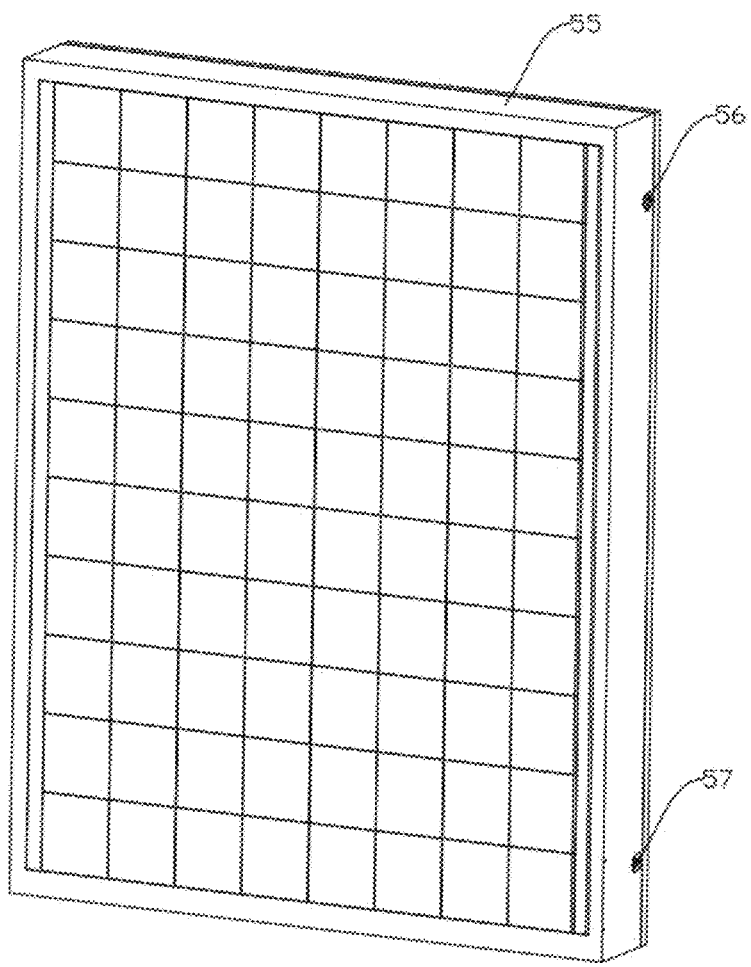
FIG. 1 is an overall schematic 3D structural view according to the present disclosure.
Figure 2:
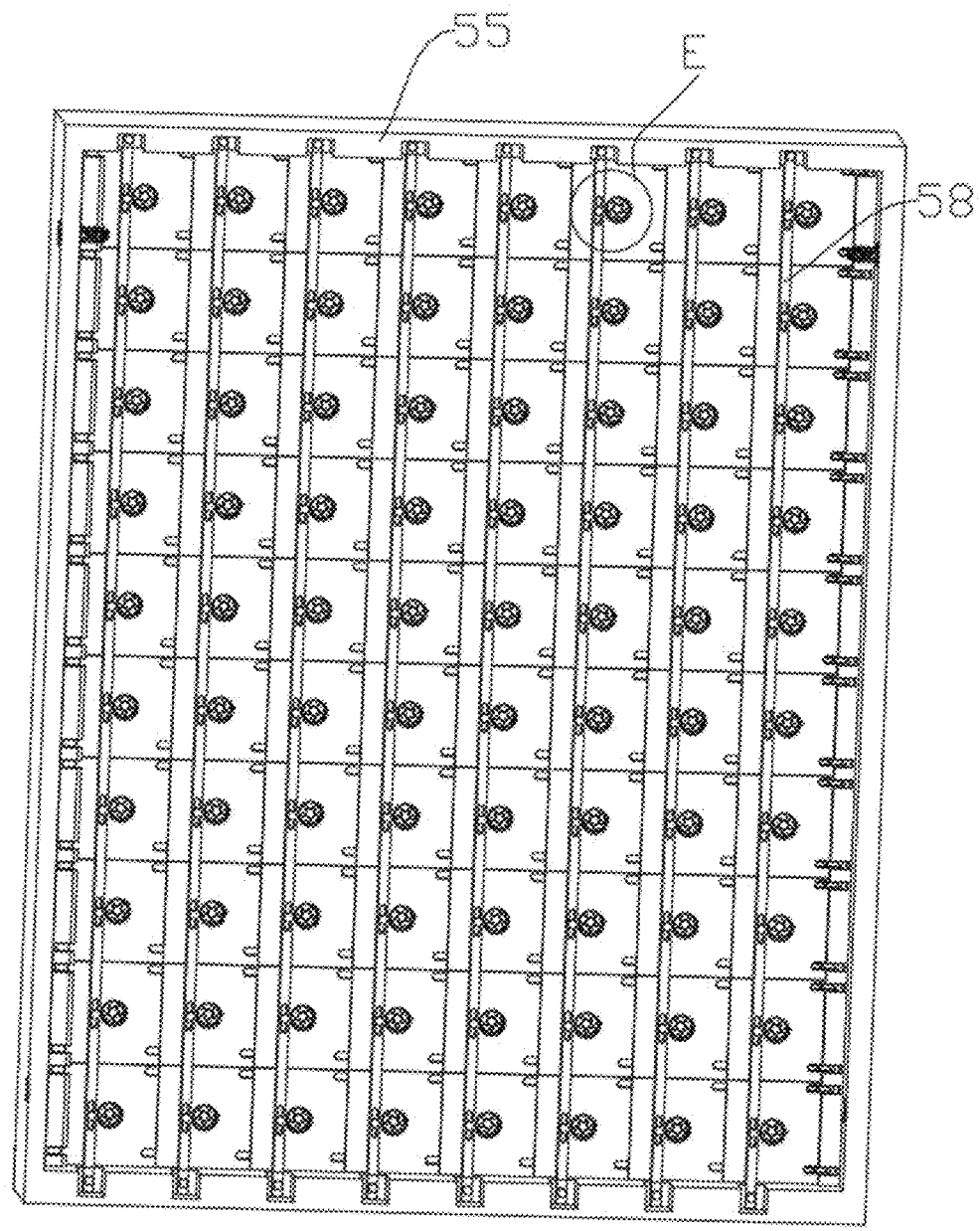
FIG. 2 is a schematic 3D structural view in a frame according to the present disclosure.
Figure 3:
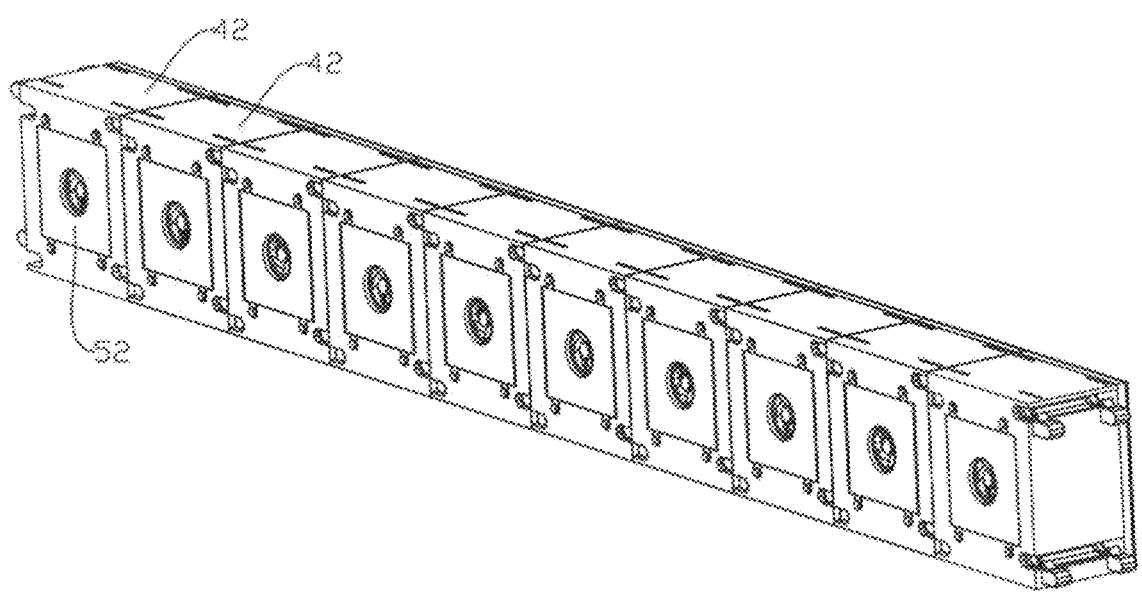
FIG. 3 is a schematic 3D structural view of a cover plate according to the present disclosure.
Figure 4:
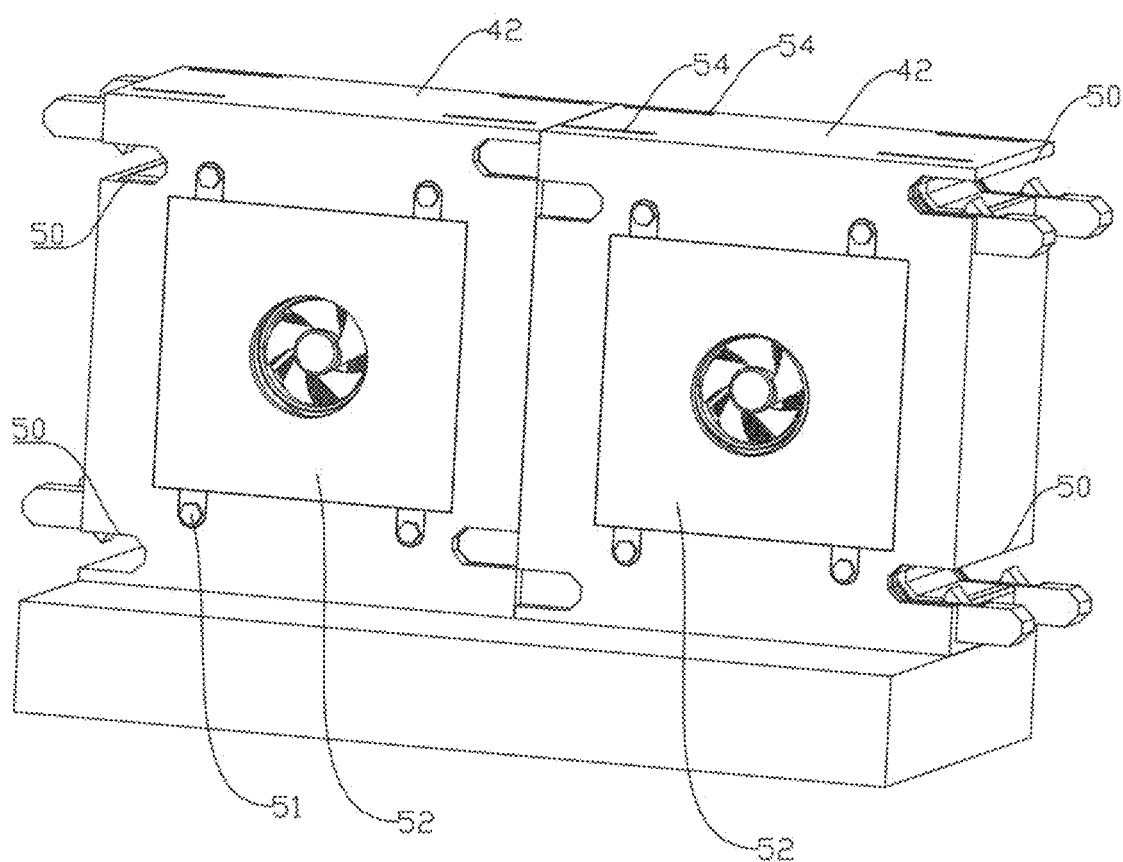
FIG. 4 is a schematic 3D structural view of a heat dissipation housing according to the present disclosure.
Figure 5:
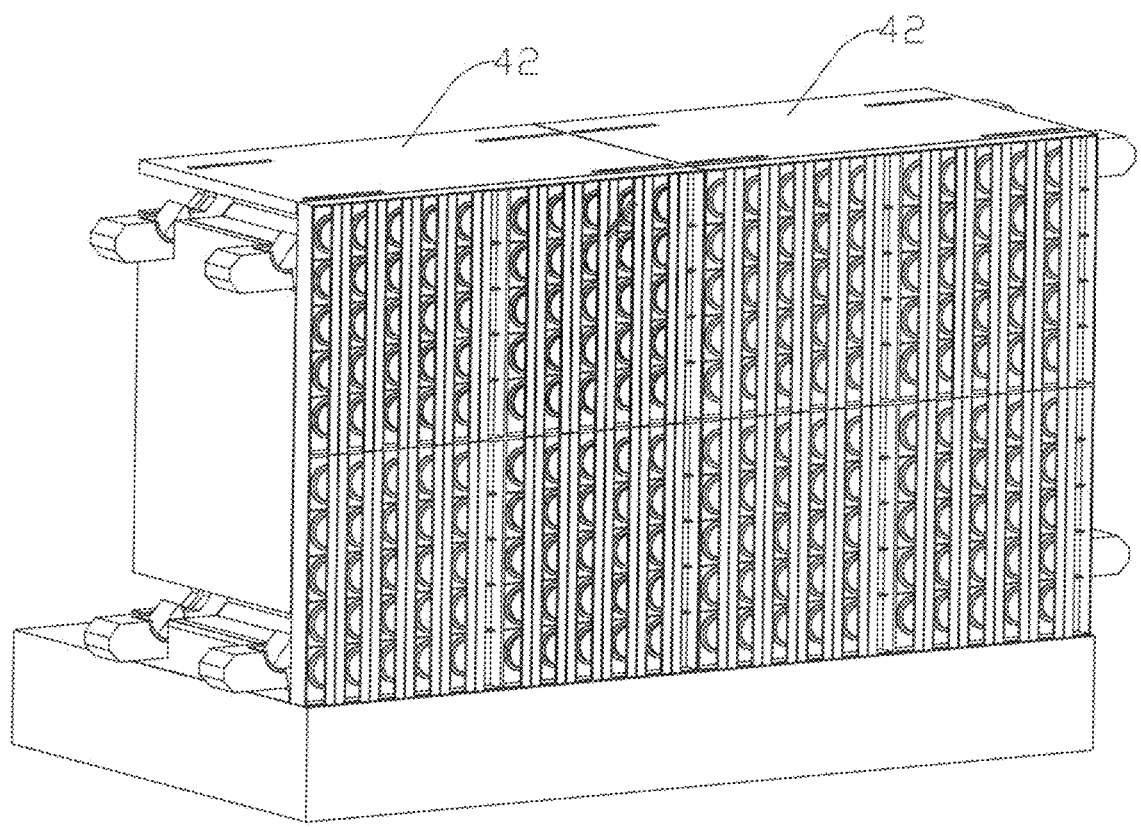
FIG. 5 is a schematic 3D structural view in an LED integrated panel according to the present disclosure.
Figure 6:
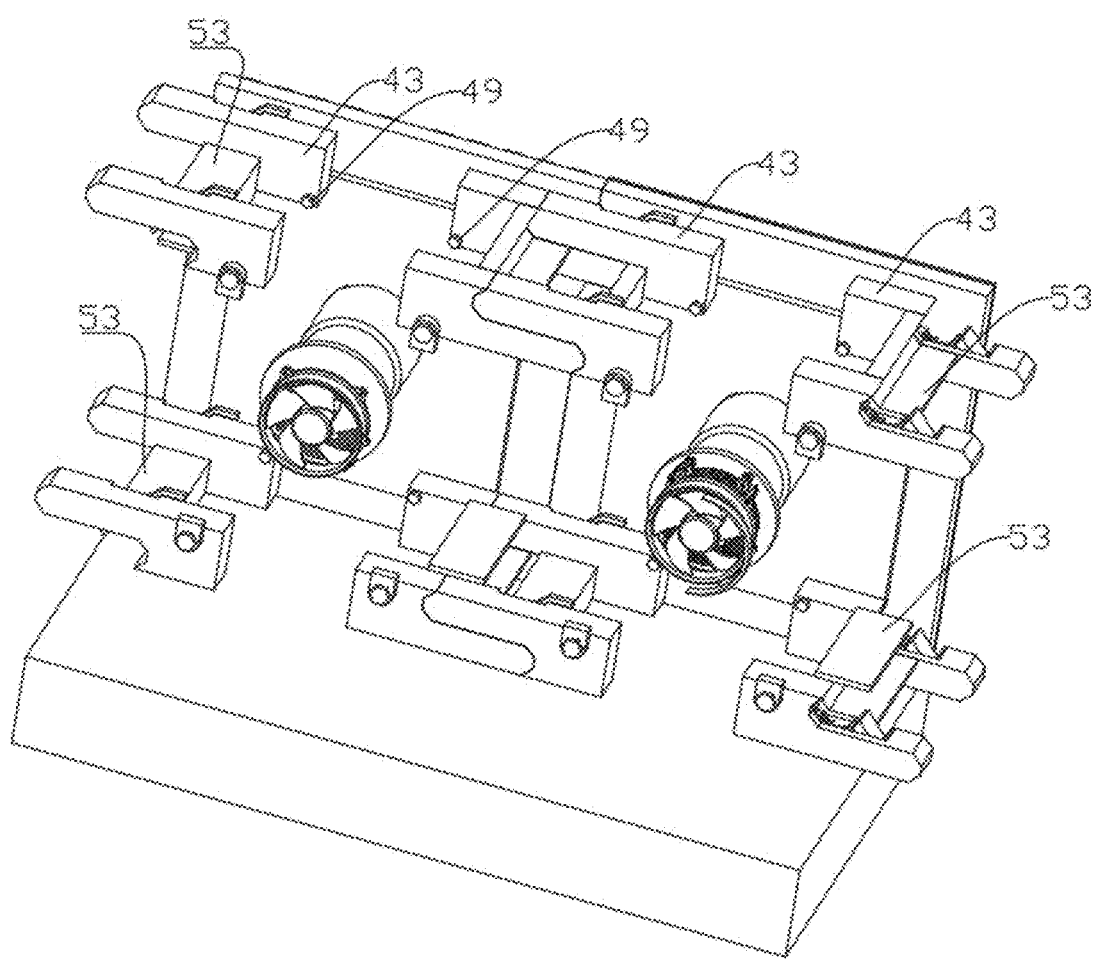
FIG. 6 is a schematic 3D structural view of a shell according to the present disclosure.
Figure 7:
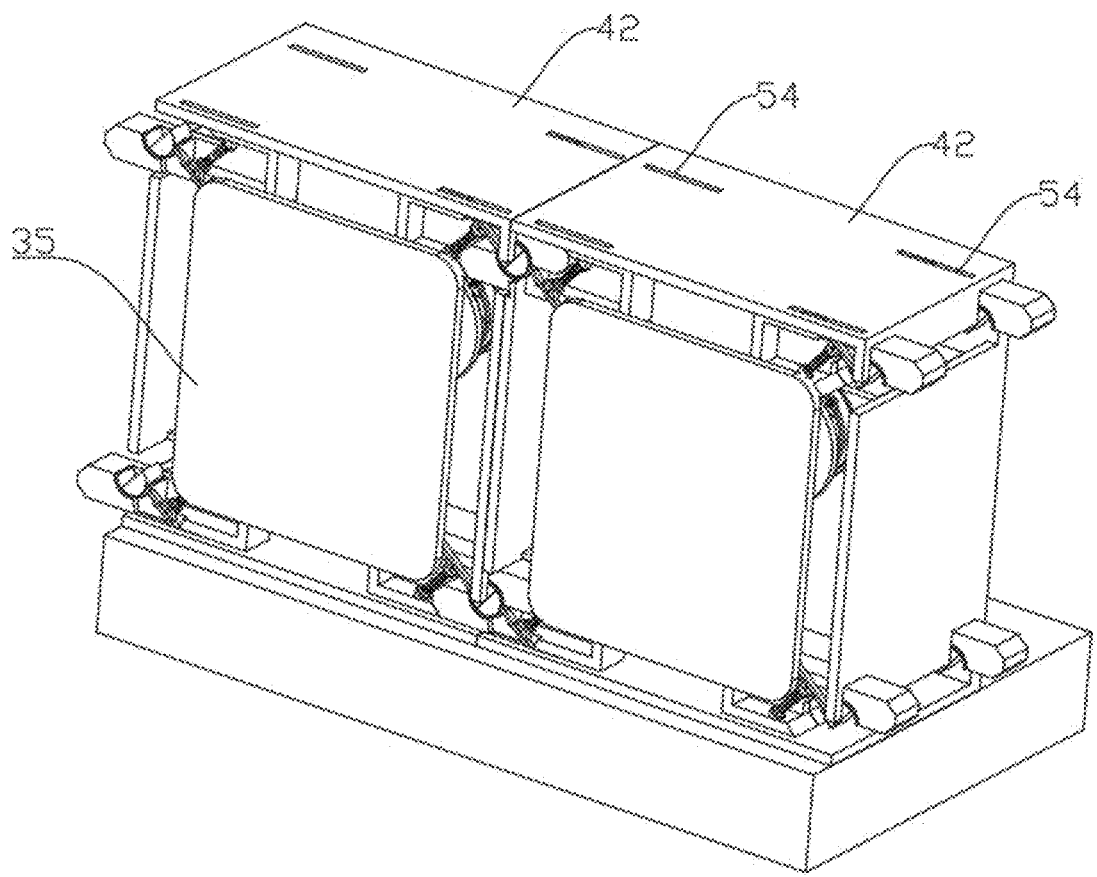
FIG. 7 is a schematic 3D structural view of a heat-dissipating aluminum plate according to the present disclosure.
Figure 8:
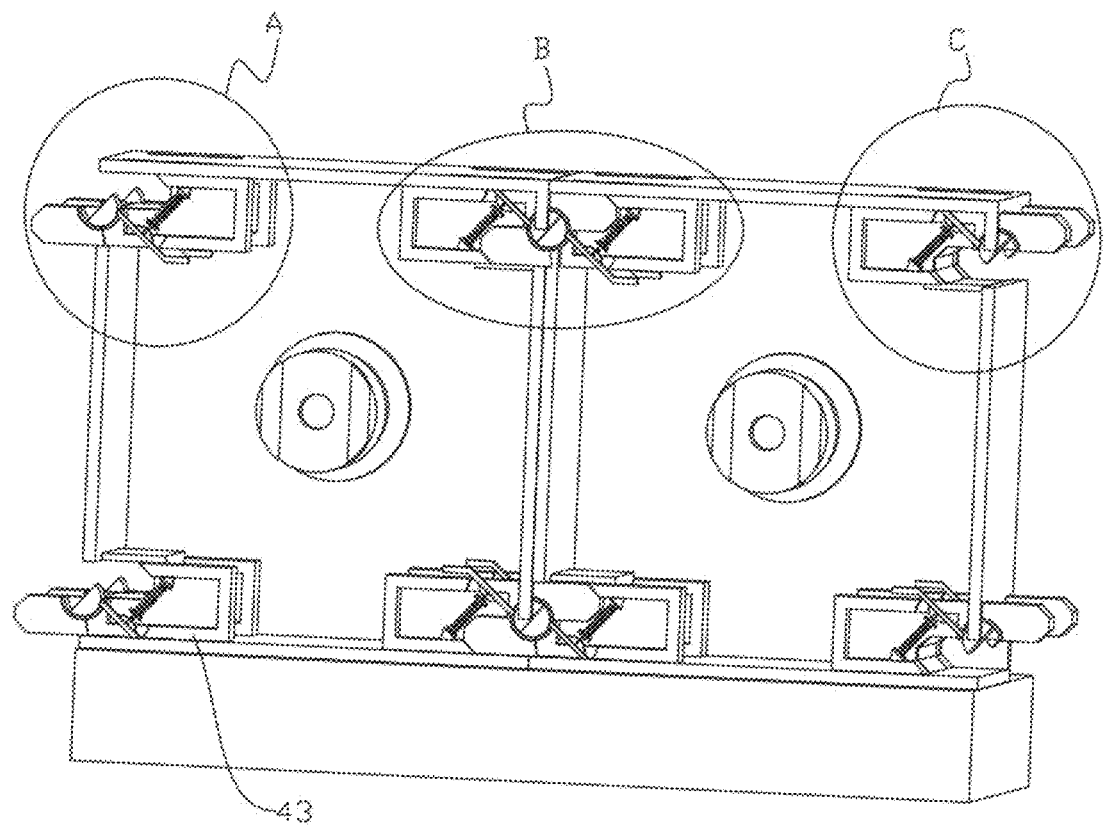
FIG. 8 is a schematic 3D structural view in a heat dissipation housing according to the present disclosure.
Figure 9:
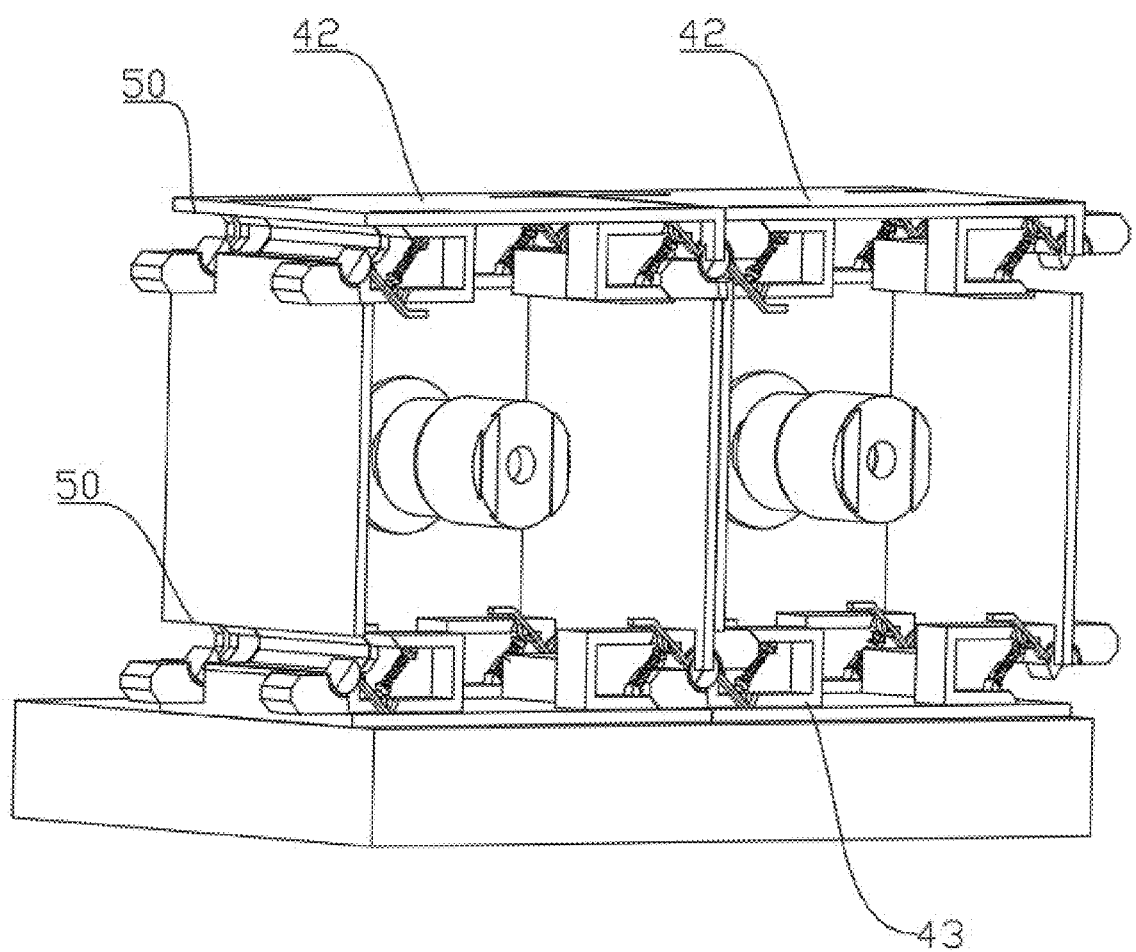
FIG. 9 is a schematic 3D structural view of a heat dissipation structure according to the present disclosure.
Figure 10:
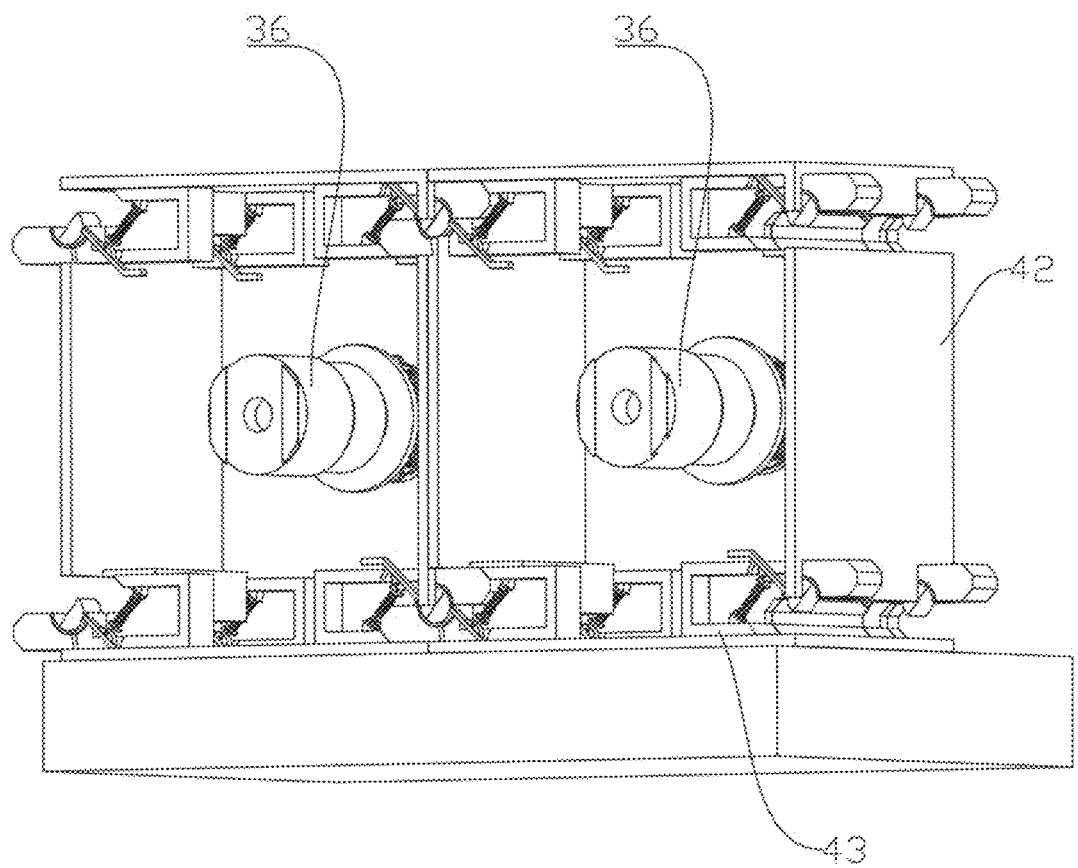
FIG. 10 is a schematic 3D structural view of an insert according to the present disclosure.
Figure 11:
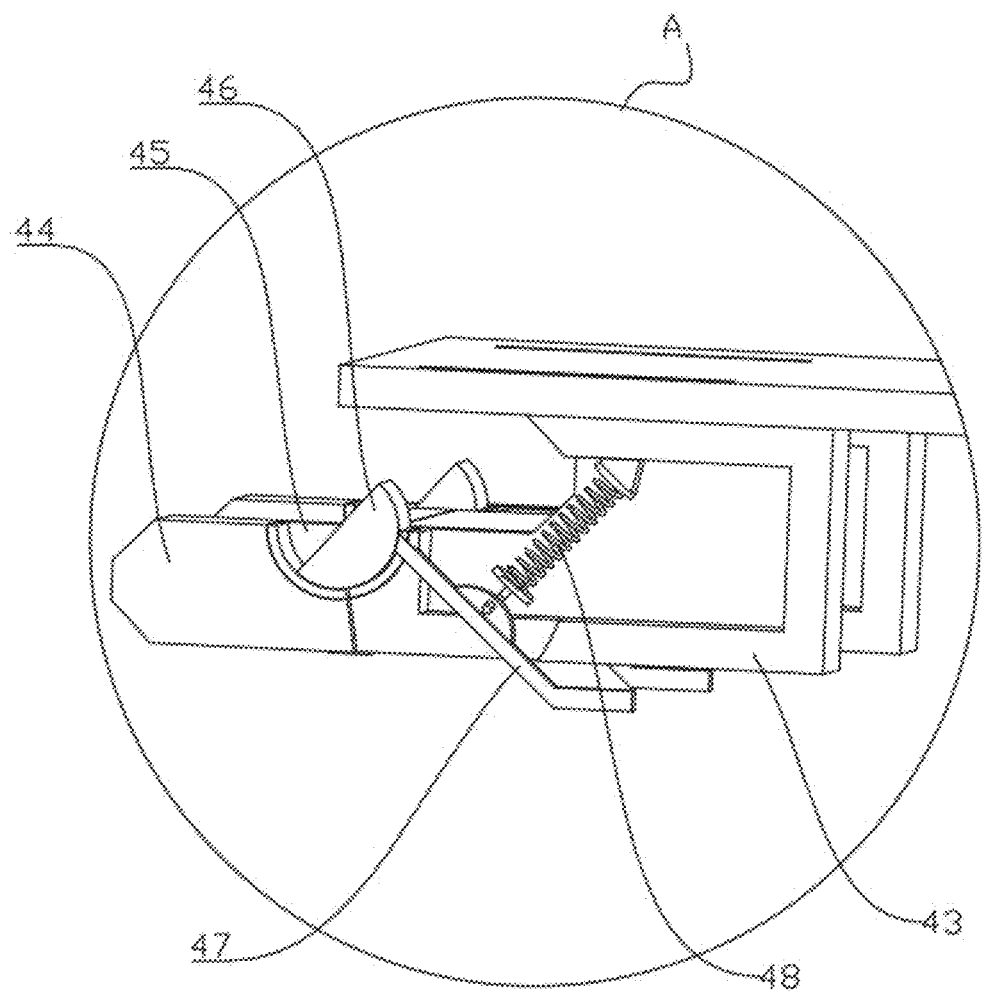
FIG. 11 is a schematic enlarged view of a structure at A shown in FIG. 8 according to the present disclosure.
Figure 12:
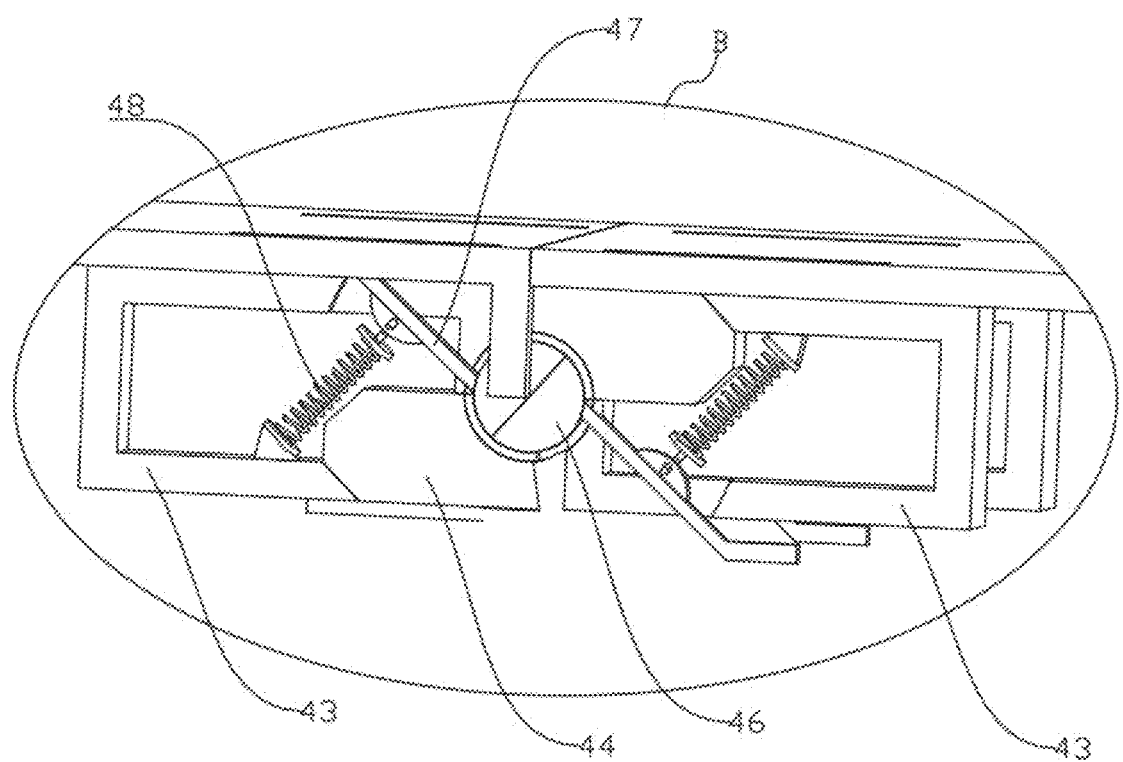
FIG. 12 is a schematic enlarged view of a structure at B shown in FIG. 8 according to the present disclosure.
Figure 13:
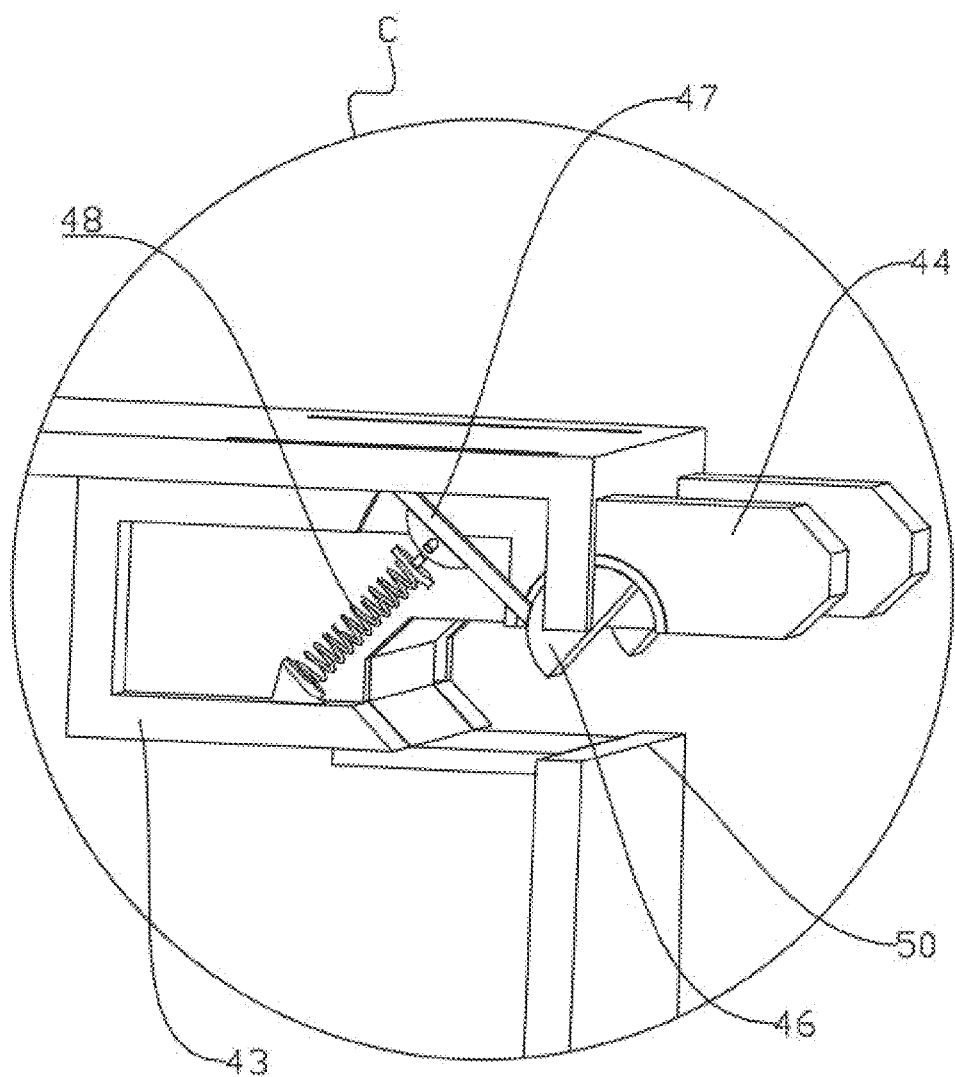
FIG. 13 is a schematic enlarged view of a structure at C shown in FIG. 8 according to the present disclosure.
Figure 14:
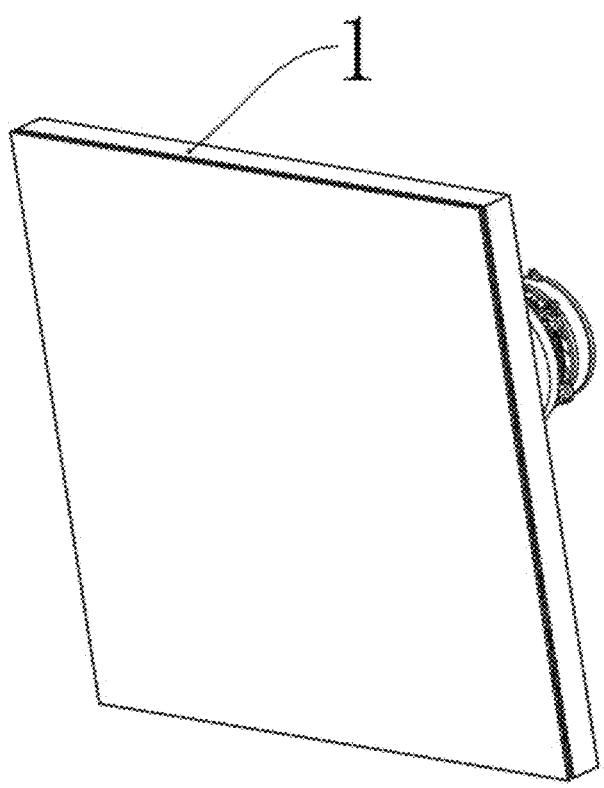
FIG. 14 is a schematic 3D structural view of an LED integrated panel according to the present disclosure.
Figure 15:
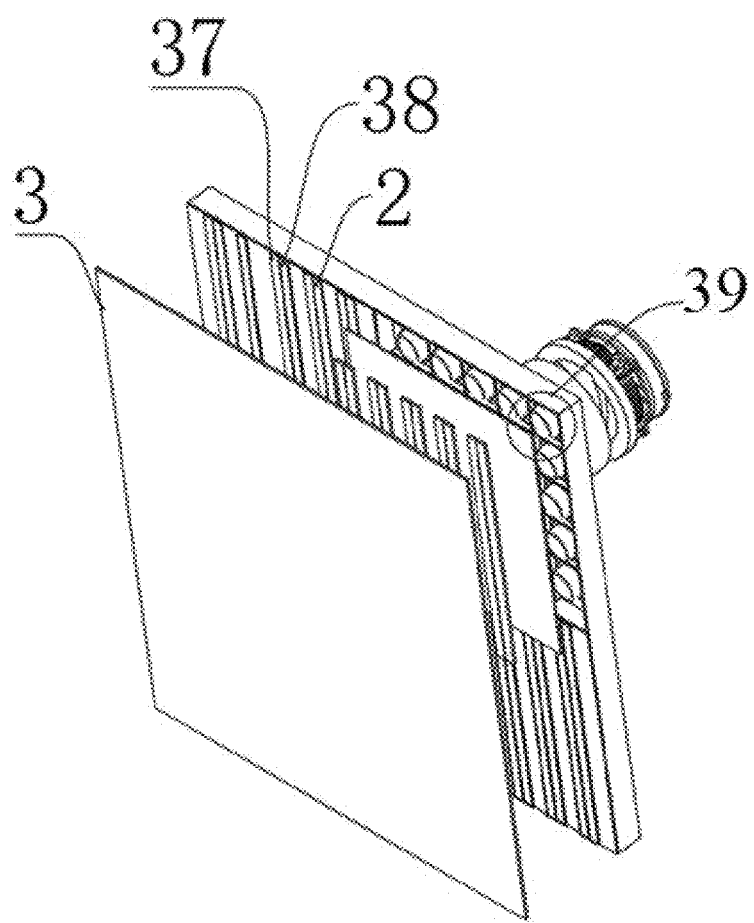
FIG. 15 is a schematic 3D structural view of a polarizing film and a single-lamp array in a separated state according to the present disclosure.
Figure 16:
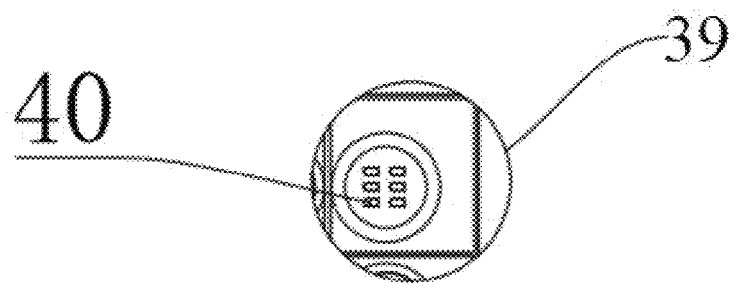
FIG. 16 is a schematic enlarged view of the LED single lamp shown in FIG. 15 according to the present disclosure.
Figure 17:
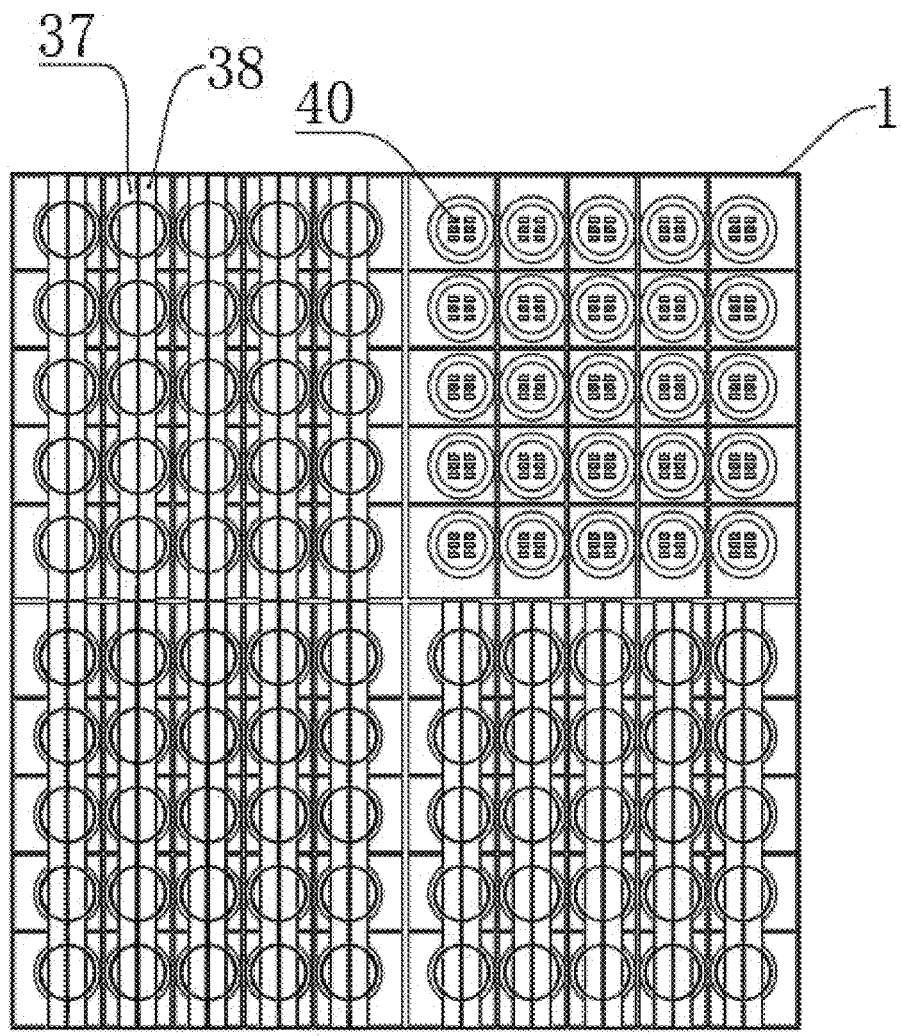
FIG. 17 is a front structural view of a left eye retardation film and a right eye retardation film according to the present disclosure.
Figure 18:
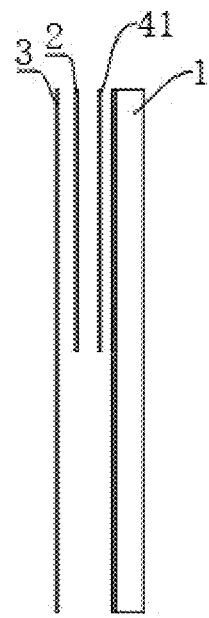
FIG. 18 is a schematic 3D structural view of a left-right eye retardation film, a polarizing film, an LED integrated panel and an optical microcrystalline mask in a separated state according to the present disclosure.
Figure 19:
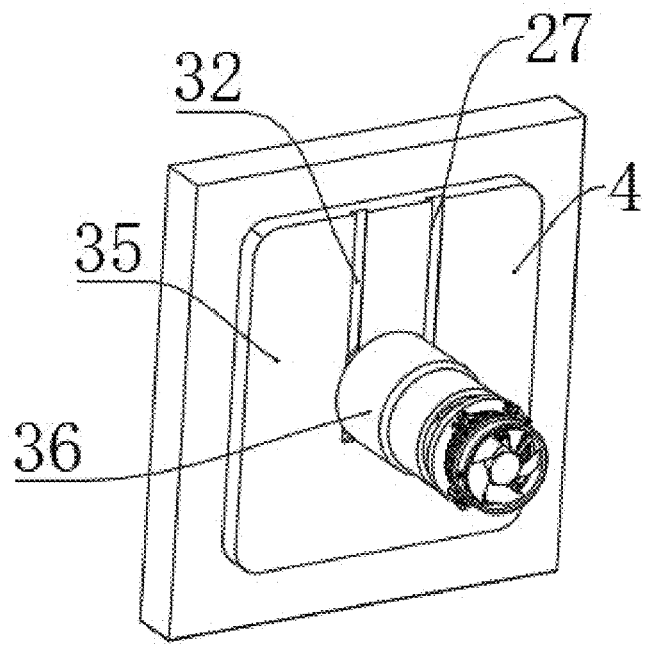
FIG. 19 is a schematic 3D structural view of a temperature sensing mechanism according to the present disclosure.
Figure 20:
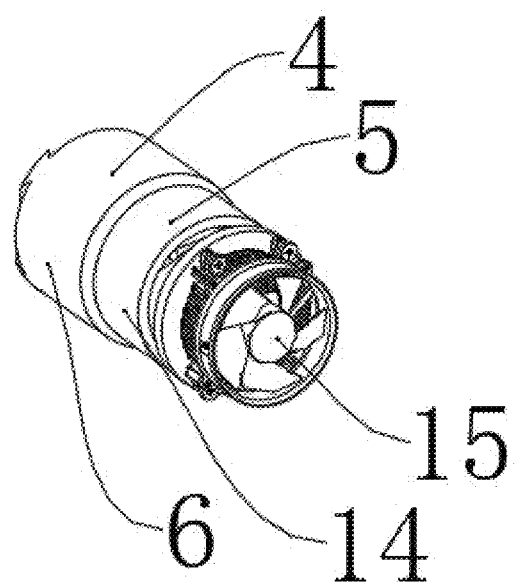
FIG. 20 is a schematic 3D structural view of a changeable transfer portion according to the present disclosure.
Figure 21:
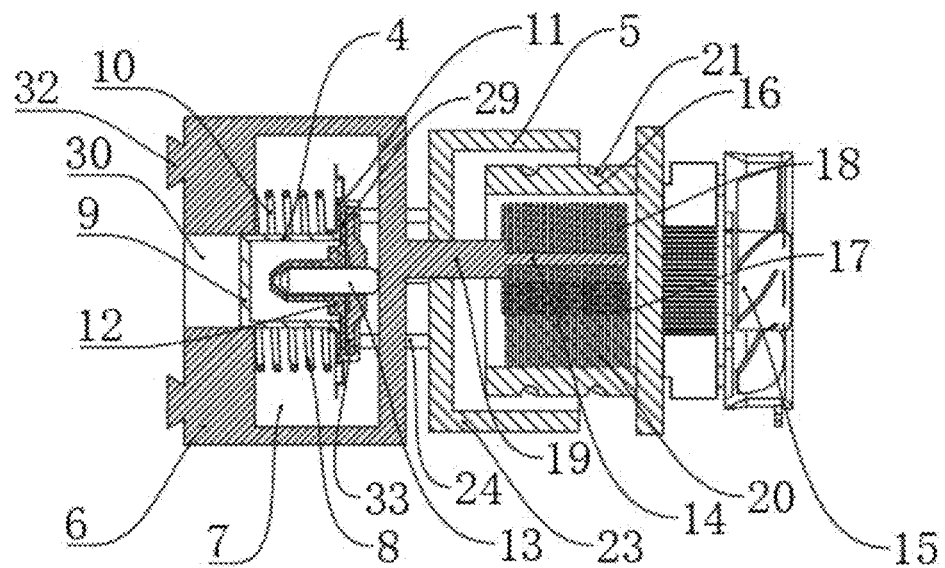
FIG. 21 is a schematic 3D structural view in a heat transfer cartridge and a helical sleeve according to the present disclosure.
Figure 22:
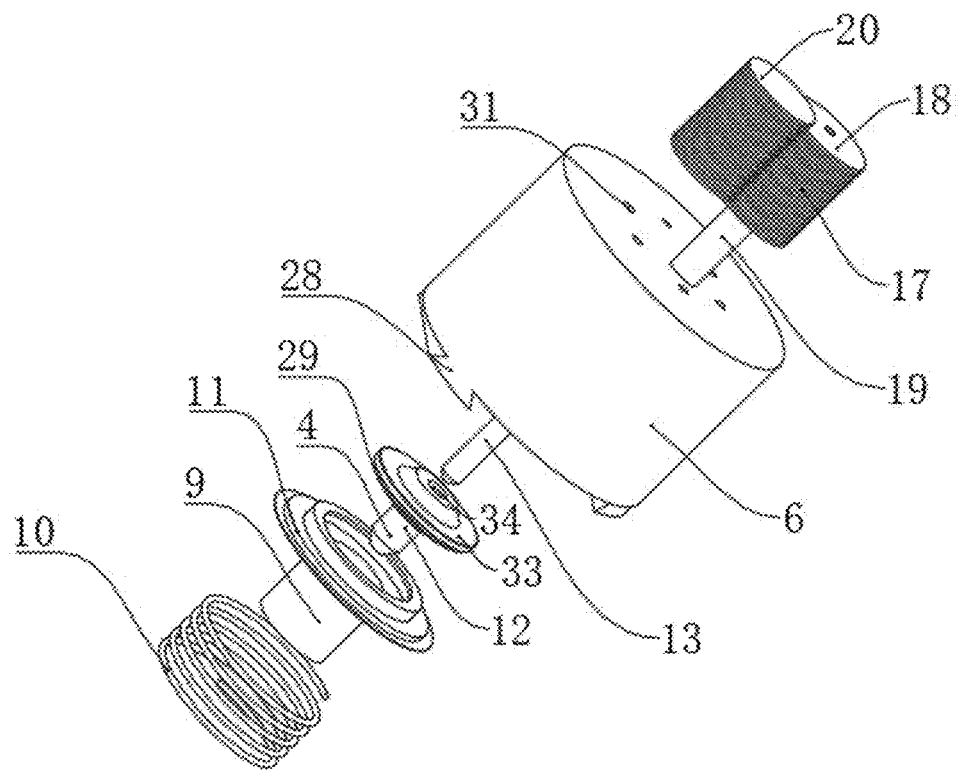
FIG. 22 is a schematic 3D structural view of a reset spring, an energy storage cartridge, a second flange plate and a heat transfer cartridge in a separated state according to the present disclosure.
Figure 23:
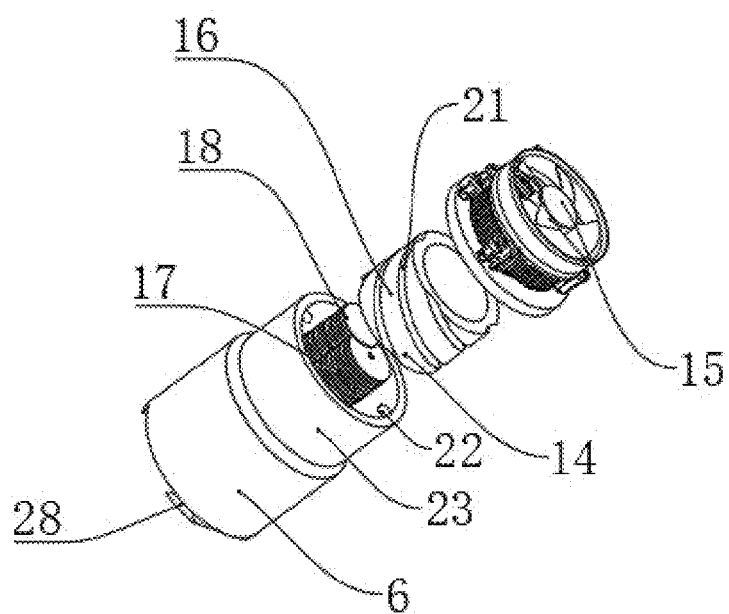
FIG. 23 is a schematic 3D structural view in a heat transfer cartridge, a helical sleeve and a heat dissipation portion in a separated state according to the present disclosure.
Figure 24:
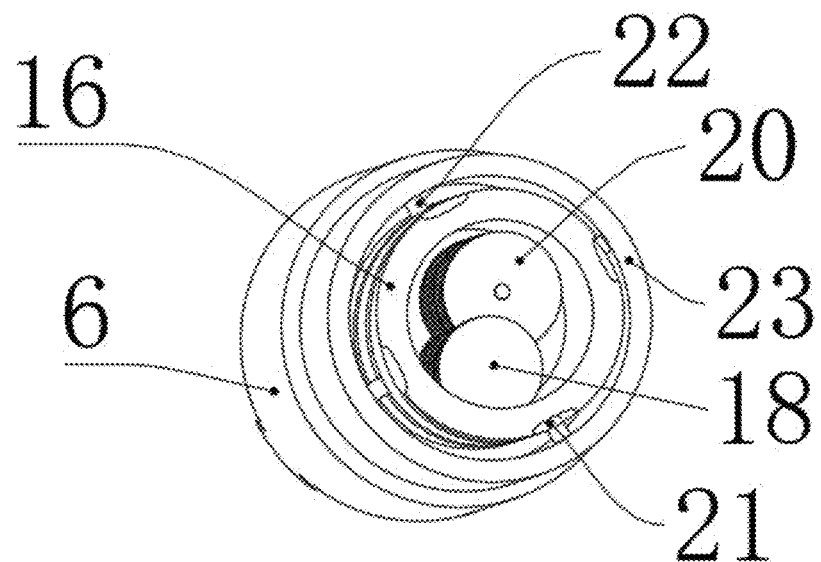
FIG. 24 is a schematic 3D structural view in a helical sleeve according to the present disclosure.
Figure 25:
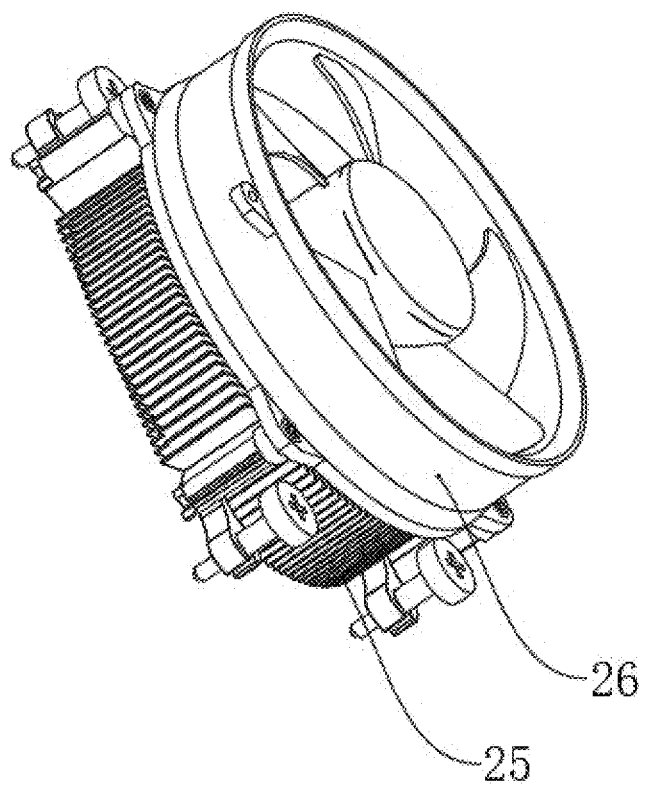
FIG. 25 is a schematic 3D structural view of a heat dissipation portion according to the present disclosure.
Figure 26:
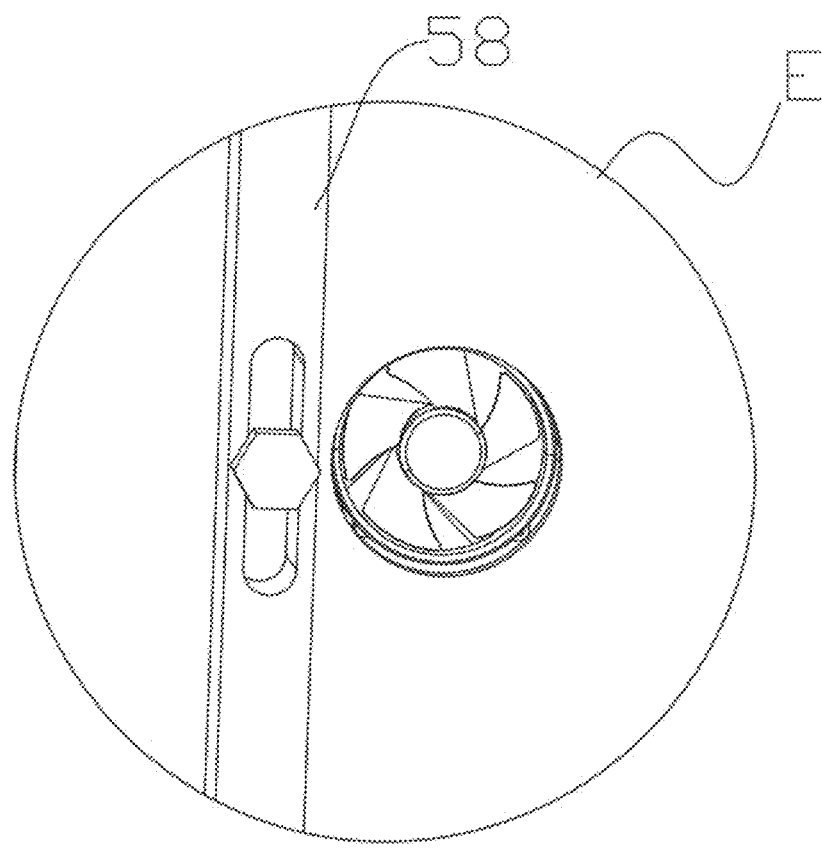
FIG. 26 is a schematic enlarged view of a structure at E shown in FIG. 2 according to the present disclosure.

Referring to FIGS. 1-26, the present disclosure provides a single-lamp dual-emission 3D LED display screen, including a plurality of LED integrated panels 1 that are distributed uniformly in a horizontal direction and a vertical direction. The LED integrated panel 1 is provided with an LED single-lamp array. Heat dissipation housing 42 is provided at a rear side of the LED single-lamp array. LED heat dissipation structure 36 is provided on a back side of the LED single-lamp array in the heat dissipation housing 42. A left side and a right side of the heat dissipation housing 42 each are provided with a snap-fit mechanism. The heat dissipation housing 42 is connected to the snap-fit mechanism of the adjacent heat dissipation housing 42 through the snap-fit mechanism. The LED single-lamp array is composed of a plurality of LED single lamps 39 that are arranged symmetrically. The LED single lamp 39 includes two LED light emitting pixels that are arranged left and right. The LED light emitting pixel includes yellow LED bead 40, green LED bead 40, and blue LED bead 40. Left-right eye retardation film 2 and polarizing film 3 are correspondingly provided on a front surface of the LED single-lamp array in sequence. A PCB is provided on a rear portion of the LED integrated panel 1. A driver chip is provided on the PCB. The driver chip is configured to control the corresponding LED light emitting pixel in the LED single-lamp array to emit light according to a preset rule. Since the PCB heats continuously in operation, the LED heat dissipation structure 36 is further provided behind the PCB, and configured to dissipate heat from the PCB to keep PCB within a reasonable temperature range all the time.

In the present disclosure, the single-lamp dual-emission refers to that two LED light emitting pixels are integrated in one LED single lamp 39. LED light emitting pixels each include the yellow LED bead 40, the green LED bead 40, and the blue LED bead 40. The driver chip is configured to control the corresponding LED light emitting pixel in the LED single-lamp array to emit the light according to the preset rule.

In assembly of the 3D LED display screen, a substrate is provided at a preset position first. The LED integrated panel 1 is assembled on an upper end surface of the substrate. Through the snap-fit mechanism, each LED integrated panel 1 to be assembled is assembled to form the large-area 3D LED display screen.

In the embodiment, the snap-fit mechanism includes shell 43 fixed to an inner top wall of the heat dissipation housing 42. Insert 44 is fixedly provided at an outer end of the shell 43. The shell 43 is located inside the heat dissipation housing 42. The insert 44 is located outside the heat dissipation housing 42. Semi-circular groove 45 is formed at a junction between the insert 44 and the shell 43. Semi-circular member 46 is rotatably connected in the semi-circular groove 45. Force rod 47 is fixedly provided on an outer surface of the semi-circular member 46. Tension spring 48 is fixedly provided between one side of the force rod 47 and an inner bottom wall of the shell 43. In the assembly of the 3D LED display screen, a position of the first LED integrated panel 1 is located first. Then, the second LED integrated panel 1 moves horizontally close to the first LED integrated panel 1, such that the insert 44 of the first LED integrated panel 1 is inserted into the shell 43 of the second LED integrated panel 1. In movement of the insert 44 of the first LED integrated panel 1, the semi-circular member 46 of the second LED integrated panel 1 is driven to rotate, such that a horizontal edge of the semi-circular member 46 is rotated to a horizontal state. Meanwhile, the insert 44 of the second LED integrated panel 1 also drives the semi-circular member 46 of the first LED integrated panel 1 to rotate, such that the horizontal edge of the semi-circular member 46 is rotated to the horizontal state. When the semi-circular groove 45 of the first LED integrated panel 1 and the semi-circular groove 45 of the second LED integrated panel 1 form one circle, the two semi-circular grooves 45 are also located at the same time in the circle formed by the two semi-circular grooves 45. The tension spring 48 pulls the semi-circular member 46 through the force rod 47 to rotate, such that the two semi-circular members 46 are rotated at the same time in the circle formed by the two semi-circular grooves 45. This realizes misplacement of the semi-circular member 46 and the semi-circular groove 45, and clamping of the first LED integrated panel 1 and the second LED integrated panel 1. By assembling each LED integrated panel 1 in sequence, the 3D LED display screen with a preset area is formed.

In order to disassemble the individual LED integrated panel 1 conveniently in daily use, in the embodiment, heat-dissipating aluminum plate 35 is fixedly provided on a rear side of the LED single-lamp array. The heat-dissipating aluminum plate 35 is fixed with the shell 43 through first bolt 49. An upper portion and a lower portion of each of the left side and the right side of the heat dissipation housing 42 each are provided with gap 50 matching with the insert 44. Cover plate 52 is fixedly provided on a rear side of the heat dissipation housing 42 through second bolt 51. When some LED integrated panel 1 is to be disassembled, the cover plate 52 is disassembled first. Then, the first bolt 49 for connecting the shell 43 and the heat-dissipating aluminum plate 35 is disassembled. The LED integrated panel 1 is then taken down. By this time, only the heat dissipation housing 42 is clamped in the whole 3D LED display screen. Then pulling the heat dissipation housing 42 backward can pull out the heat dissipation housing 42. This realizes individual disassembly of the LED integrated panel 1. When the heat dissipation housing 42 is pulled backward, the inserts 44 of the heat dissipation housing 42 pulled out move in the gaps 50 of adjacent heat dissipation housings 42 at two sides. Meanwhile, the inserts 44 of the heat dissipation housings 42 at the left side and the right side also move in the gaps 50 of the heat dissipation housing 42 pulled out. In mounting, the heat dissipation housing 42 is inserted into a corresponding position. By this time, the semi-circular member 46 of the heat dissipation housing 42 to be mounted has a same angle of inclination with the semi-circular members 46 of adjacent heat dissipation housings 42 at two sides, such that two corresponding semi-circular members 46 are located in the circle formed by the corresponding two semi-circular grooves 45, thereby realizing the mounting of the heat dissipation housings 42. At a front side, through a position of the placed LED integrated panel 1, the heat-dissipating aluminum plate 35 at the rear side of the display panel is fixedly connected to four corresponding shells 43 by the first bolt 49. The cover plate 52 is then fixed on the heat dissipation housing 42 through the second bolt 51.

Because of the gap 50 in the heat dissipation housing 42, an overall strength of the heat dissipation housing 42 is reduced. In order to improve the strength of the heat dissipation housing 42, in the embodiment, connector 53 is fixedly provided between two corresponding shells 43 in the heat dissipation housing 42 in a front-rear direction. The connector 53 is configured to connect the heat dissipation housing 42 and the shells 43 integrally. This increases overall stability of the heat dissipation housing 42.

In the embodiment, an upper end and a lower end of the heat dissipation housing 42 each are provided with avoidance notch 54. The force rod 47 is located in the corresponding avoidance notch 54. In the assembly of the 3D LED display screen, the force rod 47 of the LED integrated panel 1 in a column being assembled rotates. When an outer end of the force rod 47 rotates to protrude from a lower end surface of the heat dissipation housing 42, the outer end of the force rod 47 enters the avoidance notch 54 of the heat dissipation housing 42 of the LED integrated panel 1 in a next adjacent column.

In the embodiment, frame 55 is fixedly provided around the 3D LED display screen. A plurality of vertical rods 58 are provided in the frame 55 along a left-right direction. Two ends of each of the vertical rods 58 are fixed to the frame 55. A vertical column of heat dissipation housings 42 are fixed to corresponding vertical rods 58. A rear plate is fixedly provided on a rear side of the frame 55. A heat dissipation space is formed between the frame 55 and the rear plate. Heat produced by the LED integrated panel 1 in operation enters the heat dissipation space. An air circulation system is provided on the frame 55. The air circulation system is configured to continuously exchange air in the heat dissipation space with outside air to achieve heat dissipation. The air circulation system includes air outlet 56 formed in an upper portion of a side of the frame 55. An exhaust fan and a motor are provided in the air outlet 56. The motor is configured to drive the exhaust fan to exhaust hot air in the heat dissipation space to the outside. Air inlet 57 is formed in a lower portion of the side of the frame 55. Outside fresh air enters the heat dissipation space from the air inlet 57.

In order to improve a level of pixel integration of the LED single lamp 39, and further improve the resolution and image quality, in the present disclosure, the LED single lamp 39 includes a hollow lampshade and six LED beads 40 provided on an inner rear end surface of the lampshade. The six LED beads 40 are formed into the two LED light emitting pixels that are arranged symmetrically left and right. The LED light emitting pixels each include the yellow LED bead 40, the green LED bead 40, and the blue LED bead 40. A rear end of the LED bead 40 is welded at a corresponding position of the PCB through a pin. When the present disclosure is used, when a two-dimensional (2D) image is to be displayed, the two LED pixels in the LED single lamp 39 display a same image at the same time. When a 3D image is to be displayed, the two LED pixels in the LED single lamp 39 respectively display a left-handed image and a right-handed image. That is, there is a visual error between an image observed by a left eye of the user and an image observed by a right eye, and two parallax images are synthesized by a brain of the user, thereby perceiving the stereoscopic display.

By providing six beads 40 in the same LED single lamp 39 in left and right rows, there are two pixels in the same LED single lamp 39. This further improves the level of pixel integration of the LED single lamp 39.

In the operation of the 3D LED display module, light of the bead 40 is captured by the human eyes, and imaged through the human brain, so as to achieve corresponding angles of the left eye and the right eye for observing a same object, and synthesize the two parallax images in the brain to perceive the stereoscopic display.

In the present disclosure, the left-right eye retardation film 2 includes left eye retardation film 37 and right eye retardation film 38. The left eye retardation film 37 and the right eye retardation film 38 are respectively provided in front of a corresponding left row of three beads 40 and in front of a corresponding right row of three beads 40.

In order that the present disclosure can effectively improve the 3D dual-image synchronization, synchronization of signal transmission, and stability of image quality to prevent 3D dizziness, in the present disclosure, the driver chip uses a single-chip dual-drive scanning circuit to update a displayed video image in real time, such that spatial orientation of the video image keeps synchronous with the two eyes of the user. This reduces a phenomenon of the 3D dizziness of the user in use, greatly reduces a likelihood of dizziness, nausea, and vomit of the user, and improves user satisfaction.

In order to improve a contrast of the 3D LED display module, and reduce reflection, in the embodiment, optical microcrystalline mask 41 is further provided on a front surface of the LED integrated panel 1. The optical microcrystalline mask 41 is formed between the LED integrated panel 1 and the left-right eye retardation film 2 by potting. The optical microcrystalline mask 41 is formed by a mixture of transparent crystal epoxy resin glue and a glass microsphere. By adding the glass microsphere to the transparent crystal epoxy resin glue, the cured optical microcrystalline mask reaches a preset hardness. The transparent crystal epoxy resin glue ensures adhesion with the glass microsphere, while the glass microsphere ensures the hardness of the optical microcrystalline mask 41. The glass microsphere functions to diffuse light of the LED bead 40, such that a viewing angle of the 3D LED display module is expanded. With diffusion of the glass microsphere, an image filling rate of the dual-pixel LED bead 40 is increased.

In the operation of the LED integrated panel 1, a control unit provided in the PCB on the rear portion of the LED integrated panel 1 will produce a large amount of heat, and the PCB can operate normally only in an environment at −20° C. to 65° C. The PCB suffers thermal shock as the temperature changes constantly, thus greatly shortening the service life of the 3D LED display module.

In order to stabilize an operating temperature of the PCB, and prolong the service life of the 3D LED display module, in the present disclosure, the LED heat dissipation structure 36 includes heat-dissipating aluminum plate 35 provided at a rear end of the LED integrated panel 1. Temperature sensing mechanism 4 is further provided behind the heat-dissipating aluminum plate 35. In the operation, the heat of the LED integrated panel 1 is transferred to the temperature sensing mechanism 4 through the heat-dissipating aluminum plate 35. The temperature sensing mechanism 4 is configured to convert different heat of the LED integrated panel 1 into a driving force, thereby driving heat dissipation fin adjusting mechanism 5 to change a heat dissipating capacity.

In the present disclosure, the LED heat dissipation structure 36 further includes the heat dissipation fin adjusting mechanism 5 provided behind the temperature sensing mechanism 4. In the operation, through the changeable driving force of the temperature sensing mechanism 4, the heat dissipation fin adjusting mechanism 5 is driven to adjust the heat dissipating capacity of the LED heat dissipation structure 36. This adjusts an environmental temperature of the LED integrated panel 1 in the operation to prolong the service life of the LED integrated panel 1.

In order that the heat of the LED integrated panel 1 can be converted into a temperature signal more accurately, in the present disclosure, the temperature sensing mechanism 4 includes hollow heat transfer cartridge 6 provided on a rear surface of the heat-dissipating aluminum plate 35. An outer wall of the heat transfer cartridge 6 is made of metal copper with desirable thermal conductivity. In the operation, the heat of the LED integrated panel 1 is transferred to the outer wall of the heat transfer cartridge 6 through the heat-dissipating aluminum plate 35. The heat is transferred to inner cavity 7 of the heat transfer cartridge through a temperature rise of the outer wall of the heat transfer cartridge 6.

In order that the heat of the LED integrated panel 1 can be converted into the temperature signal more accurately, in the present disclosure, the inner cavity 7 of the heat transfer cartridge is further concentrically provided with thermal expansion portion 8. The thermal expansion portion 8 is slidably connected to the heat transfer cartridge 6. The thermal expansion portion 8 includes energy storage cartridge 9. The energy storage cartridge 9 is shaped as a barrel with a rear end open and a front end sealed. First flange plate 11 is provided on a rear end surface of the energy storage cartridge 9. Plunger accommodation cartridge 12 is further inserted into an opening at the rear end of the energy storage cartridge 9. Second flange plate 29 is provided on a rear end surface of the plunger accommodation cartridge 12. The plunger accommodation cartridge 12 is suspended on a rear portion of the energy storage cartridge 9. A front surface of the second flange plate 29 of the plunger accommodation cartridge 12 is closely attached to a rear end surface of the first flange plate 11. An outer surface of the plunger accommodation cartridge 12 and an inner surface of the energy storage cartridge 9 form a confined space. Plunger 13 is further inserted into the plunger accommodation cartridge 12. A rear end of the plunger 13 protrudes from the rear end surface of the plunger accommodation cartridge 12. In the embodiment, the plunger accommodation cartridge 12 is made of an elastic rubber material. Paraffin is filled in the confined space formed by the outer surface of the plunger accommodation cartridge 12 and the inner surface of the energy storage cartridge 9. In the operation, the paraffin melts when heated, changing from a solid into a liquid. As a volume of the paraffin expands constantly, a pressure in the confined space is increased continuously. The pressure squeezes the plunger accommodation cartridge 12 from the outside, such that a volume in the plunger accommodation cartridge 12 is decreased constantly, and a front end surface of the plunger 13 is squeezed continuously. Under an action of the pressure, the plunger 13 and the plunger accommodation cartridge 12 move relatively, thereby converting the heat of the LED integrated panel 1 into the driving force.

In order to realize relative movement between the plunger 13 and the plunger accommodation cartridge 12 in the inner cavity 7 of the heat transfer cartridge, in the embodiment, avoidance hole 30 is formed at an axis of a bottom cover of the heat transfer cartridge 6. The energy storage cartridge 9 is inserted into the avoidance hole 30 and slidably connected to the bottom cover of the heat transfer cartridge 6. A front end surface of a top cover of the heat transfer cartridge 6 abuts against the rear end surface of the plunger 13. Reset spring 10 is further sleeved on the energy storage cartridge 9. The reset spring 10 includes one end fixed on the rear portion of the energy storage cartridge 9, and the other end fixed at a rear end surface of the bottom cover of the heat transfer cartridge 6. In a natural state of the reset spring 10, the plunger 13 is located at a bottom of the plunger accommodation cartridge 12. That is, a pressure outside the plunger accommodation cartridge 12 is insufficient to drive the plunger 13 and the energy storage cartridge 9 to move relatively. When the pressure outside the plunger accommodation cartridge 12 starts to increase, and is sufficient to drive the plunger 13 and the energy storage cartridge 9 to move relatively, a space of the inner cavity of the plunger accommodation cartridge 12 is compressed. There is a pressure to drive the plunger 13, such that the plunger 13 tends to move backward. Since an inner side of the top cover of the heat transfer cartridge 6 abuts against a rear surface of the plunger 13, the energy storage cartridge 9 pushed by a counter-acting force moves forward along the avoidance hole 30. The reset spring 10 is compressed, until a spring pressure is sufficient to balance a pressure caused by the change of the paraffin from the solid to the liquid in the energy storage cartridge 9.

In order to allow a mechanical motion to drive the heat dissipation fin adjusting mechanism 5 to adjust the heat dissipating capacity according to different heat of the LED integrated panel 1, thereby adjusting the environmental temperature of the LED integrated panel 1 in the operation, in the embodiment, the heat dissipation fin adjusting mechanism 5 is further provided behind the heat transfer cartridge 6. The heat dissipation fin adjusting mechanism 5 includes changeable transfer portion 14 and heat dissipation portion 15. The changeable transfer portion 14 is provided behind the heat transfer cartridge 6. The changeable transfer portion 14 includes helical sleeve 16 and changeable heat transfer fin 17. The helical sleeve 16 is sleeved on the changeable heat transfer fin 17. The helical sleeve 16 and a top cover of the heat transfer cartridge 6 are provided concentrically. The changeable heat transfer fin 17 includes stationary fin 18 provided eccentrically with the top cover of the heat transfer cartridge 6. The stationary fin 18 is shaped as a circular disc and fixedly connected to the top cover of the heat transfer cartridge 6 through concentrically provided heat transfer pillar 19. In order to enhance a heat transfer effect, in the embodiment, a plurality of uniformly-spaced stationary fins 18 are fixed on a rear portion of the heat transfer pillar 19. Rotary fin 20 is inserted into a gap between two adjacent ones of the uniformly-spaced stationary fins 18. The rotary fin 20 includes an inner end inserted into the gap between the two adjacent uniformly-spaced stationary fins 18, and an outer end fixed on an inner wall of the helical sleeve 16.

In the operation, the helical sleeve 16 rotates along an axis, thereby driving the rotary fin 20 to rotate around the axis. The inner end of the rotary fin 20 rotates around the eccentrically provided stationary fin 18. A contact area between the stationary fin 18 and the rotary fin 20 inserted into the gap between the two adjacent stationary fins 18 changes. The heat dissipating capacity also changes with the change of the contact area.

In order to drive the helical sleeve 16 to rotate along the axis, in the present disclosure, helical groove 21 is further formed in an outer surface of the helical sleeve 16. Cylindrical pin 22 is provided in the helical groove 21. The cylindrical pin 22 is provided along a radial direction of the helical sleeve 16. An inner end of the cylindrical pin 22 is slidably connected to the corresponding helical groove 21. In the operation, the cylindrical pin 22 moves back and forth, such that the helical sleeve 16 rotates with a curvature of the helical groove 21.

In order that when the heat of the LED integrated panel 1 changes, the cylindrical pin 22 can be driven by the temperature signal to move back and forth, thereby driving the helical sleeve 16 to rotate with the curvature of the helical groove 21, and changing a heat transfer area of the fin to adjust the heat dissipating capacity, in the embodiment, drive sleeve 23 is fixed at an outer end of the cylindrical pin 22. A bottom of the drive sleeve 23 extends through the top cover of the heat transfer cartridge 6 through guide rod 24, until fixedly connected to the energy storage cartridge 9. The top cover of the heat transfer cartridge 6 is provided with through hole 31 corresponding to the guide rod 24. The top cover of the heat transfer cartridge 6 is slidably connected to the guide rod 24.

In the embodiment, heat dissipation portion 15 is further provided on a rear end surface of the changeable conduction portion 14. The heat dissipation portion 15 includes heat dissipation fin 25 and electric fan 26 provided behind the heat dissipation fin 25. In the operation, the electric fan 26 is driven by an internal motor, so as to accelerate airflow in the heat dissipation fin 25, and facilitate heat dissipation of the heat dissipation fin 25. The driving process of the electric fan 26 belongs to the prior art, and is not repeated herein.

In order that the LED heat dissipation structure 36 can be closely attached to the heat-dissipating aluminum plate 35, in the embodiment, quick connection structure 32 is further provided on a rear surface of the heat-dissipating aluminum plate 35. The quick connection structure 32 includes dovetail groove 27 provided on a rear portion of the heat-dissipating aluminum plate 35 and dovetail pin 28 correspondingly provided on a front portion of the heat transfer cartridge 6. In the operation, the dovetail pin 28 on the front portion of the heat transfer cartridge 6 moves up, such that the LED heat dissipation structure 36 is separated from the rear portion of the LED integrated panel 1. The dovetail pin 28 on the front portion of the heat transfer cartridge 6 moves down, such that the LED heat dissipation structure 36 is fixed at the rear end of the LED integrated panel 1.

In order to allow the plunger 13 to form a horizontal motion trajectory, in the embodiment, circular end cover 33 is further concentrically provided at the rear end of the plunger accommodation cartridge 12. The circular end cover 33 is fixedly connected to the rear end of the plunger accommodation cartridge 12. Guide hole 34 corresponding to the plunger 13 is formed in a center of the circular end cover 33. The plunger 13 extends through the guide hole 34 and is slidably connected to the circular end cover 33.

As the temperature of the LED integrated panel 1 rises gradually, the LED heat dissipation structure 36 is fixed behind the LED integrated panel 1 through the dovetail groove 27 of the LED heat dissipation structure 36 and the dovetail pin 28 correspondingly provided on the front portion of the heat transfer cartridge 6. When the LED integrated panel 1 just starts to operate, the rear portion of the LED integrated panel 1 has a relatively low temperature. The temperature in the LED integrated panel 1 is transferred to the thermal expansion portion 8 through the heat transfer cartridge 6. Nonetheless, at a relatively low temperature, the paraffin in the energy storage cartridge 9 cannot change from the solid to the liquid. That is, the pressure in the energy storage cartridge 9 does not change, and the plunger 13 is located at a most front end of the plunger accommodation cartridge 12. By this time, there is a farthest distance along a radial direction between the stationary fin 18 connected to the top cover of the heat transfer cartridge 6 and the rotary fin 20 inserted into the gap between the two adjacent uniformly-spaced stationary fins 18. That is, the contact area between the stationary fin 18 and the rotary fin 20 is minimal, and the heat transferred to the heat dissipation portion 15 along the contact area is minimal.

The present disclosure has the following operating principle: When some LED integrated panel 1 is to be disassembled, the cover plate 52 is disassembled first. Then, the first bolt 49 for connecting the shell 43 and the display panel is disassembled. The panel is then taken down. By this time, only the heat dissipation housing 42 is clamped in the whole 3D LED display screen. Then pulling the heat dissipation housing 42 backward can pull out the heat dissipation housing 42. This realizes individual disassembly of the LED integrated panel 1. When the heat dissipation housing 42 is pulled backward, the inserts 44 of the heat dissipation housing 42 pulled out move in the gaps 50 of adjacent heat dissipation housings 42 at two sides. Meanwhile, the inserts 44 of the heat dissipation housings 42 at the left side and the right side also move in the gaps 50 of the heat dissipation housing 42 pulled out. In mounting, the heat dissipation housing 42 is inserted into a corresponding position. By this time, the semi-circular member 46 of the heat dissipation housing 42 to be mounted has a same angle of inclination with the semi-circular members 46 of adjacent heat dissipation housings 42 at two sides, such that two corresponding semi-circular members 46 are located in the circle formed by the corresponding two semi-circular grooves 45, thereby realizing the mounting of the heat dissipation housings 42. At a front side, through a position of the placed display panel, the heat-dissipating aluminum plate 35 at the rear side of the display panel is fixedly connected to four corresponding shells 43 by the first bolt 49. The cover plate 52 is then fixed on the heat dissipation housing 42 through the second bolt 51.

What is claimed is:
1. A single-lamp dual-emission three-dimensional (3D) light emitting diode (LED) display screen, comprising a plurality of LED integrated panels that are distributed uniformly in a horizontal direction and a vertical direction, wherein the plurality of LED integrated panels each are provided with an LED single-lamp array; a heat dissipation housing is provided at a rear side of the LED single-lamp array; an LED heat dissipation structure is provided on a back side of the LED single-lamp array in the heat dissipation housing; a left side and a right side of the heat dissipation housing each are provided with a snap-fit mechanism; the heat dissipation housing is connected to the snap-fit mechanism of an adjacent heat dissipation housing through the snap-fit mechanism; the LED single-lamp array comprises a plurality of LED single lamps that are arranged symmetrically; the plurality of LED single lamps each comprise two LED light emitting pixels that are arranged left and right; the LED light emitting pixels each comprise a yellow LED bead, a green LED bead, and a blue LED bead; a left-right eye retardation film and a polarizing film are correspondingly provided on a front surface of the LED single-lamp array in sequence; a printed circuit board (PCB) is provided on a rear portion of the LED integrated panel; a driver chip is provided on the PCB; and the driver chip is configured to control the corresponding LED light emitting pixel in the LED single-lamp array to emit light according to a preset rule;

wherein the snap-fit mechanism comprises a shell fixed to an inner top wall of the heat dissipation housing; an insert is fixedly provided at an outer end of the shell; the shell is located inside the heat dissipation housing; the insert is located outside the heat dissipation housing; a semi-circular groove is formed at a junction between the insert and the shell; a semi-circular member is rotatably connected in the semi-circular groove; a force rod is fixedly provided on an outer surface of the semi-circular member; and a tension spring is fixedly provided between one side of the force rod and an inner bottom wall of the shell;

wherein a heat-dissipating aluminum plate is fixedly provided on a rear side of the LED single-lamp array; the heat-dissipating aluminum plate is fixed with the shell through a first bolt; an upper portion and a lower portion of each of the left side and the right side of the heat dissipation housing each are provided with a gap matching with the insert; and a cover plate is fixedly provided on a rear side of the heat dissipation housing through a second bolt;

wherein an upper end and a lower end of the heat dissipation housing each are provided with an avoidance notch; and the force rod is located in the corresponding avoidance notch;

wherein the LED heat dissipation structure comprises a heat-dissipating aluminum plate provided at a rear end of the LED integrated panel; a temperature sensing mechanism is provided behind the heat-dissipating aluminum plate; a thermal expansion portion is concentrically provided in the temperature sensing mechanism; the LED heat dissipation structure further comprises a heat dissipation fin adjusting mechanism, a rotary fin, and a stationary fin; and the thermal expansion portion is configured to adjust a contact area between the rotary fin and the stationary fin through the heat dissipation fin adjusting mechanism based on a temperature signal acquired by the temperature sensing mechanism.

2. The single-lamp dual-emission 3D LED display screen according to claim 1, wherein a connector is fixedly provided between two corresponding shells in the heat dissipation housing in a front-rear direction; and the connector is configured to connect the heat dissipation housing and the shells integrally.

3. The single-lamp dual-emission 3D LED display screen according to claim 2, wherein a frame is fixedly provided around the single-lamp dual-emission 3D LED display screen; a plurality of vertical rods are provided in the frame along a left-right direction; two ends of each of the plurality of vertical rods are fixed to the frame; a vertical column of heat dissipation housings are fixed to the corresponding vertical rods; a rear plate is fixedly provided on a rear side of the frame; a heat dissipation space is formed between the frame and the rear plate; an air circulation system is provided on the frame; the air circulation system comprises an air outlet formed in an upper portion of a side of the frame; an exhaust fan and a motor are provided in the air outlet; and an air inlet is formed in a lower portion of the side of the frame.

4. The single-lamp dual-emission 3D LED display screen according to claim 1, wherein the LED single lamp comprises a hollow lampshade and six LED beads provided on an inner rear end surface of the hollow lampshade; the six LED beads are formed into the two LED light emitting pixels that are arranged symmetrically left and right; the LED light emitting pixels each comprise the yellow LED bead, the green LED bead, and the blue LED bead; and a rear end of the LED bead is welded at a corresponding position of the PCB through a pin.

5. The single-lamp dual-emission 3D LED display screen according to claim 1, wherein the left-right eye retardation film comprises a left eye retardation film and a right eye retardation film; and the left eye retardation film and the right eye retardation film are respectively provided in front of a corresponding left row of three LED beads and in front of a corresponding right row of three LED beads.

6. The single-lamp dual-emission 3D LED display screen according to claim 1, wherein an optical microcrystalline mask is provided on a front surface of the LED integrated panel; and the optical microcrystalline mask is formed between the LED integrated panel and the left-right eye retardation film by potting.

\* \* \* \* \*